(12) United States Patent
Bhosle et al.

(10) Patent No.: US 9,780,250 B2
(45) Date of Patent: Oct. 3, 2017

(54) SELF-ALIGNED MASK FOR ION IMPLANTATION

(71) Applicant: Varian Semiconductor Equipment Associates, Inc., Gloucester, MA (US)

(72) Inventors: Vikram M. Bhosle, North Reading, MA (US); Timothy J. Miller, Ipswich, MA (US); Tapash Chakraborty, Thane (IN); Prerna Goradia, Mumbai (IN); Robert J. Visser, Menlo Park, CA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 5 days.

(21) Appl. No.: 14/995,698

(22) Filed: Jan. 14, 2016

(65) Prior Publication Data

US 2017/0207361 A1    Jul. 20, 2017

(51) Int. Cl.
*H01L 31/18* (2006.01)
*H01L 31/0224* (2006.01)
*H01L 31/068* (2012.01)
*H01L 21/266* (2006.01)

(52) U.S. Cl.
CPC ...... *H01L 31/18* (2013.01); *H01L 31/022458* (2013.01); *H01L 21/266* (2013.01); *H01L 31/0682* (2013.01); *H01L 31/1804* (2013.01)

(58) Field of Classification Search
CPC ............... H01L 21/266; H01L 31/0682; H01L 31/1804; H01L 31/18; H02L 31/022458
See application file for complete search history.

(56) References Cited

U.S. PATENT DOCUMENTS

| | | | |
|---|---|---|---|
| 5,668,020 A * | 9/1997 | Lee | H01L 21/2253 148/DIG. 61 |
| 8,372,737 B1 | 2/2013 | Bateman et al. | |
| 8,465,909 B2 | 6/2013 | Bateman et al. | |
| 8,664,126 B2 | 3/2014 | Yao | |
| 8,906,802 B2 | 12/2014 | Wahl et al. | |
| 9,087,941 B2 | 7/2015 | Hekmatshoartabari et al. | |
| 2002/0055220 A1* | 5/2002 | Soderbarg | H01L 21/82380 438/234 |
| 2010/0004144 A1* | 1/2010 | Little | B01J 19/0046 506/17 |
| 2010/0193799 A1* | 8/2010 | Nakano | H01L 29/1608 257/77 |

(Continued)

*Primary Examiner* — Thanh T Nguyen
(74) *Attorney, Agent, or Firm* — Nields, Lemack & Frame, LLC

(57) ABSTRACT

An improved method of doping a workpiece is disclosed. The method is particularly beneficial to the creation of interdigitated back contact (IBC) solar cells. A patterned implant is performed on one surface of the workpiece. A self-aligned masking process is then performed, which is achieved by exploiting the changes in surface properties caused by the patterned implant. The masking process includes applying a coating that preferentially adheres to the previously implanted regions. A blanket implant is then performed, which serves to implant the portions of the workpiece that are not covered by the coating. Thus, the blanket implant is actually a complementary implant, doping the regions that were not implanted by the first patterned implant. The coating is then optionally removed from the workpiece.

18 Claims, 2 Drawing Sheets

(56) References Cited

U.S. PATENT DOCUMENTS

2011/0031576 A1* 2/2011 Iwasa ............... H01L 21/26513
  257/440
2013/0064989 A1 3/2013 Hatem et al.
2015/0332917 A1* 11/2015 Sato ................... C23C 16/0272
  438/685

* cited by examiner

US 9,780,250 B2

SELF-ALIGNED MASK FOR ION IMPLANTATION

FIELD

This disclosure relates to a method of processing a workpiece and, more particularly, to the creation of a self-aligned mask for creating complementary doped regions using ion implantation.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Solar cells are one example of a device that uses silicon workpieces. Any reduced cost to the manufacture or production of high-performance solar cells or any efficiency improvement to high-performance solar cells would have a positive impact on the implementation of solar cells worldwide. This will enable the wider availability of this clean energy technology.

The doping pattern for certain types of solar cell, such as interdigitated back contact (IBC) solar cells, may include both p-type and n-type dopant regions disposed on the same surface of the solar cell. Certain portions of the surface may be implanted with p-type dopants to create emitters. Other portions are implanted with n-type dopants to create more negatively biased back surface fields. The surface may then be coated with a passivating layer to enhance the reflectivity. Metal fingers are attached to the emitter and to the BSF.

Thus, to form the IBC solar cell, two patterned doping processes may be performed. These patterned doping processes are aligned to prevent the p-type emitters and the n-type back surface fields from overlapping. Poor alignment or overlapping may be prevented by leaving a gap between the p-type emitter and the n-type back surface field, but this may degrade performance of the solar cell. Even when properly aligned, such patterned doping may have large manufacturing costs. For example, photolithography or hard masks (such as an oxide) may be used, but both are expensive and use extra fabrication processes.

Therefore, it would be beneficial if there were an improved method of high precision doping for solar cells and, more particularly, an improved method of high precision doping for IBC solar cells using ion implantation.

SUMMARY

An improved method of doping a workpiece is disclosed. The method is particularly beneficial to the creation of interdigitated back contact (IBC) solar cells. A patterned implant is performed on one surface of the workpiece. A self-aligned masking process is then performed, which is achieved by exploiting the changes in surface properties caused by the patterned implant. The masking process includes applying a coating that preferentially adheres to the previously implanted regions. A blanket implant is then performed, which serves to implant the portions of the workpiece that are not covered by the coating. Thus, the blanket implant is actually a complementary implant, doping the regions that were not implanted by the first patterned implant. The coating is then optionally removed from the workpiece.

In one embodiment, a method of creating complementary implanted regions on a workpiece is disclosed. The method comprises performing a patterned implant, where a mask, disposed separate from the workpiece, is used to block first ions from reaching portions of the workpiece, creating first implanted regions and unimplanted regions; applying a coating directly on the workpiece to only the first implanted regions of the workpiece; and performing a second implant while the coating is disposed on the first implanted regions, so that second ions of the second implant are implanted into the unimplanted regions, forming second implanted regions. In certain embodiments, the coating is applied using molecular layer deposition. In certain further embodiments, applying the coating comprises: applying a first material to a surface of the workpiece, wherein the first material adheres to the first implanted regions; and alternately depositing a first precursor and a second precursor on the first material so as to form a polymeric compound on the first implanted regions.

In one embodiment, a method of creating complementary implanted regions on a workpiece is disclosed. The method comprises performing a patterned implant, where a mask is used to block first ions from reaching portions of the workpiece, creating first implanted regions and unimplanted regions; applying a coating to the workpiece, wherein the coating adheres to the first implanted regions and does not adhere to the unimplanted regions; and performing a second implant while the coating is disposed on the first implanted regions, so that second ions of the second implant are implanted into the unimplanted regions, forming second implanted regions, and wherein the coating blocks the second ions from penetrating the first implanted regions. In certain embodiments, the first implanted regions are made hydrophilic by the patterned implant, and the coating adheres to hydrophilic surfaces. In certain embodiments, the first ions comprise a dopant species and a surface modifying species. In certain embodiments, a second patterned implant is performed, wherein the patterned implant implants a dopant species and the second patterned implant implants a surface modifying species.

In one embodiment, a method of creating complementary implanted regions on a workpiece is disclosed. The method comprises performing a patterned implant using first ions, wherein the first ions comprise a dopant species and a surface modifying species, so as to create first implanted regions and unimplanted regions, wherein the first implanted regions become hydrophilic; applying a polymeric coating to the workpiece, using molecular layer deposition, wherein the polymeric coating adheres to the first implanted regions and does not adhere to the unimplanted regions; and performing a second implant using second ions while the polymeric coating is disposed on the first implanted regions, wherein the polymeric coating blocks the second ions from the first implanted regions and the second ions are implanted into the unimplanted regions, forming second implanted regions.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments are described herein in connection with an ion implanter. Beamline ion implanters, plasma doping ion implanters, focused plasma systems, systems that modulate a plasma sheath, or flood ion implanters may be used. However, gaseous diffusion, furnace diffusion, laser doping, other plasma processing tools, or other methods known to those skilled in the art also may be used. While specific n-type and p-type dopants are listed, other n-type or p-type dopants may be used instead and the embodiments herein are not limited solely to the dopants listed. Furthermore, while one particular embodiment of a solar cell is specifically listed, embodiments of this process may be applied to other solar cell designs or other workpieces, such as semiconductor wafers or flat panels. Thus, the disclosure is not limited to the specific embodiments described below.

Figure 1:
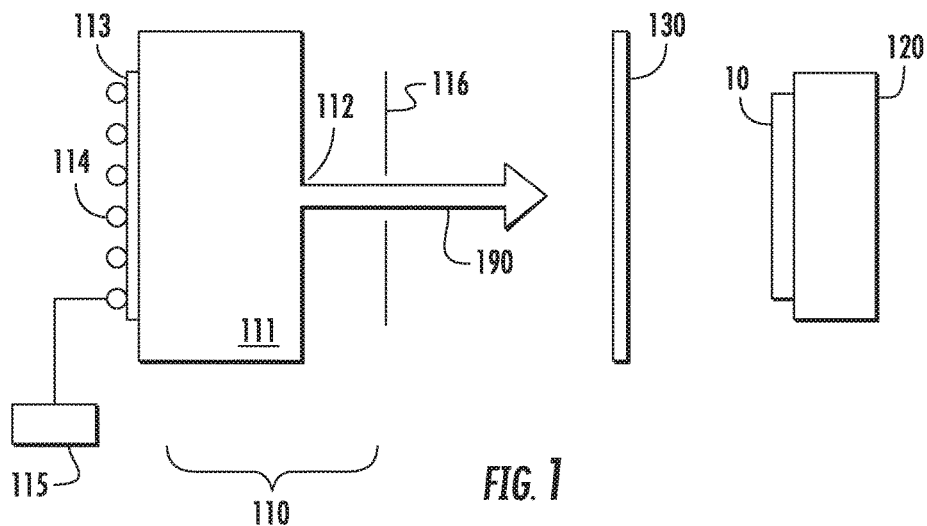
FIG. 1 shows an apparatus that may be used to process the workpiece according to one embodiment.

FIG. 1 shows a representative ion implantation system 100 that may be used to process the workpiece 10 so as to form a solar cell. The ion implantation system 100 may include an ion source 110, a workpiece support 120 and a mask 130. An ion beam 190 is extracted from the ion source 110 and directed toward the workpiece 10, which is disposed on the workpiece support 120. A mask 130 may be disposed between the ion source 110 and the workpiece 10 and may serve to block a portion of the ion beam 190 from reaching the workpiece 10.

In one particular embodiment, the ion source 110 may include an ion source chamber 111 having an extraction aperture 112. On the side opposite the extraction aperture 112 may be a dielectric window 113. An RF antenna 114 may be disposed proximate the dielectric window 113. An RF power supply 115 may be in communication with the RF antenna 114. Energy supplied by the RF antenna 114 may cause gasses within the ion source chamber 111 to form a plasma. In some embodiments, the ions may be extracted from the ion source chamber 111 using an electrode 116 disposed proximate the extraction aperture 112, on the outside of the ion source chamber 111. The electrode 116 may have an aperture, aligned with the extraction aperture 112. The electrode 116 may be negatively biased so that positively charged ions are attracted from the ion source chamber 111. The ions pass through the extraction aperture 112 and the aperture in the electrode 116 and may form an ion beam 190.

In certain embodiments, a mass analyzer (not shown) may be used to separate the various ions extracted from the ion source chamber 111 so that only ions of a particular charge and mass are directed toward the workpiece 10. In other embodiments, a mass analyzer is not used such that all extracted ions reach the workpiece 10.

In certain embodiments, an electrode 116 is not used. Rather, the workpiece support 120 may be negatively biased to attract positively charged ions from the ion source chamber 111.

The ion beam 190 extracted from the ion source 110 may be a spot ion beam, a ribbon ion beam, or an ion beam of another shape. In certain embodiments, the ion beam 190 is scanned or otherwise manipulated prior to reaching the workpiece 10. Of course, other types of ion sources may be used, and the disclosure is not limited to this, or any particular, implementation.

The mask 130 is disposed between the ion source 110 and the workpiece 10, and serves to block a portion of the ions in the ion beam 190 from reaching the workpiece 10. The mask 130 may be disposed a distance from the workpiece 10 and be separate from the workpiece 10. This mask 130 may be referred to as a shadow mask or a proximity mask. For example, the mask 130 may be held in place by a separate apparatus (not shown), or may be connected to the workpiece support 120. The mask 130 may be a material suitable for implantation, such as, for example, graphite. Further, the mask 130 may have one or more apertures which define the implant pattern that the workpiece is exposed to. Additionally, the mask 130 may be movable, such that some implants, referred to as patterned implants, may be performed with the mask 130 in place, while other implants, referred to as blanket implants, are performed without the mask 130.

To create certain semiconductor devices, such as, for example, IBC solar cells, two dopant regions are created on a single surface. These dopant regions may be, for example, an n-type doped region and a p-type doped region. The n-type dopant region and the p-type dopant region may be complementary, implying that each location on the surface of the workpiece is either an n-type doped region or a p-type doped region. In other words, there are no regions on the surface of the workpiece that are not doped. Further, there are no regions on the surface of the workpiece that are doped by both n-type and p-type dopants.

To achieve complementary dopant regions, the implanted regions of the n-type dopant and p-type dopant may be precisely controlled. Masks may be used to perform two patterned implants. The process of performing two patterned implants using one or more masks may be performed. However, aligning the patterns optically and/or mechanically can be challenging at times depending on the dimensions of the dopant regions.

The present disclosure describes a novel method of creating two complementary dopant regions using self-aligned masks. The implanting of certain species into a workpiece may affect surface properties of that workpiece, such as its morphology, crystallinity, chemical characteristics, hydrophobicity and hydrophilicity. For example, many different species, such as $CF_4$, $CHF_3$, $C_3F_6$, $BF_3$, $SF_6$, $SiF_4$, $NF_3$, He, and $O_2$, can be implanted for the purpose of modulating surface energies to make the surface of the workpiece either more hydrophobic or more hydrophilic. For example, surfaces can be made more hydrophobic with the implant of certain species, such as $CF_4$. However, other species, such as fluorinated carbons (including $CHF_3$ and $C_xF_y$), $BF_3$, $SF_6$ and $SiF_4$ may also be used to create a more hydrophobic surface. Surfaces can be made more hydrophilic with an implant of $NF_3$. However, other species, such as $O_2$ and He, may also be used. This list of species is not intended to be inclusive, but rather illustrates some of the species that can be used to affect surface energy of a workpiece. By exploiting these changes in surface properties, it is possible to coat the surface of the workpiece using an organic or inorganic coating such that the coating adheres to only one of the hydrophobic and hydrophilic regions of the workpiece. Once in place, this coating serves as a self-aligned mask for a second implant, and blocks ions from the second implant from penetrating the regions that were previously implanted.

Figure 2:
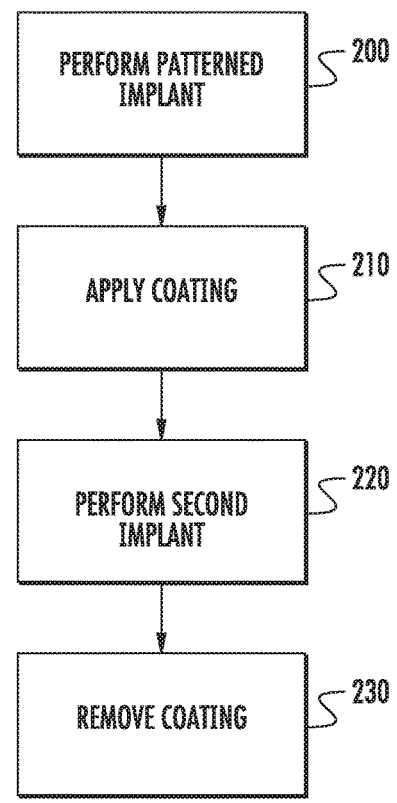
FIG. 2 is a flowchart illustrating the fabrication sequence used to create the complementary doped regions.

FIG. 2 shows a representative process that may be used to create a workpiece having complementary doped regions according to one embodiment. First, as shown in Process 200, a patterned implant is performed. This patterned implant may be performed using a mask 130, as shown in FIG. 1. The pattern that is created is not limited by the present disclosure. The patterned implant is used to implant first ions into the workpiece.

Figure 3A:
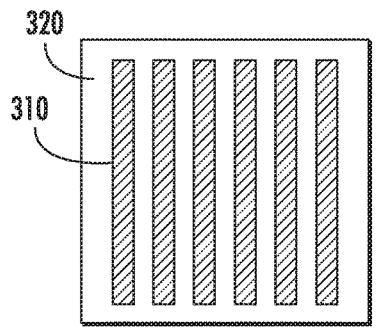
FIGS. 3A-3D show a first workpiece being processed using the sequence of FIG. 2.
Figure 4A:
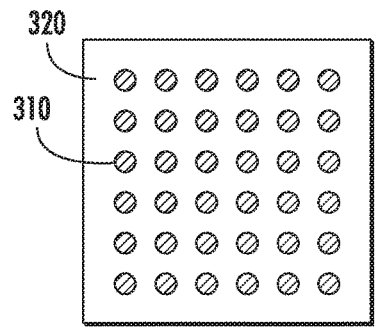
FIGS. 4A-4D show a second workpiece being processed using the sequence of FIG. 2.

FIGS. 3A-3D show a first workpiece being processed using the sequence of FIG. 2. In this embodiment, the workpiece is being implanted using a mask having a plurality of striped apertures. FIGS. 4A-4D show a second workpiece being processed using the sequence of FIG. 2. In this embodiment, the workpiece is being implanted using a mask having a plurality of circular apertures. After the patterned implant, each workpiece has first implanted regions 310 and unimplanted regions 320. The first implanted regions 310 of the workpiece are created using a patterned implant, where the mask 130 (see FIG. 1) has apertures that correspond to the first implanted regions 310. The shape of the first implanted regions 310 is not limited by this disclosure. FIGS. 3A and 4A illustrate two different shapes, however other shapes are also possible. For example, in certain embodiments, oval or elliptical shapes may also be used.

The first implanted regions 310 may be formed using only one ion species, such as when mass analysis is performed. In other embodiments, the first implanted regions 310 are created using a plurality of different ion species. In one embodiment, multiple ion species may be implanted by using an ion source 110 without mass analysis. In other embodiments, multiple ion species may be implanted by performing two or more patterned implants, where each patterned implant introduces one ion species.

In certain embodiments where more than one ion species is implanted, the first implanted regions 310 may contain a dopant species, such as a p-type or n-type dopant, and a surface modifying species. In certain embodiments, the dopant species and the surface modifying species may be the same species. In certain embodiments, the patterned implant of FIG. 2 may comprise one or more patterned implants. The patterned implant serves to implant first ions into the first implanted regions 310 of the workpiece, where the first ions may comprise a dopant species and a surface modifying species.

Figure 3B:
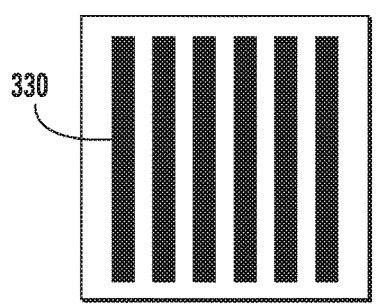
Figure 4B:
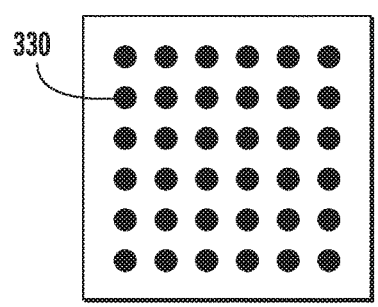
Figure 3C:
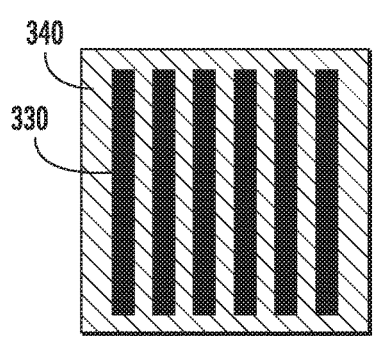
Figure 4C:
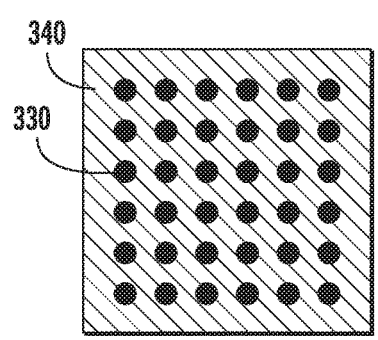
Figure 3D:
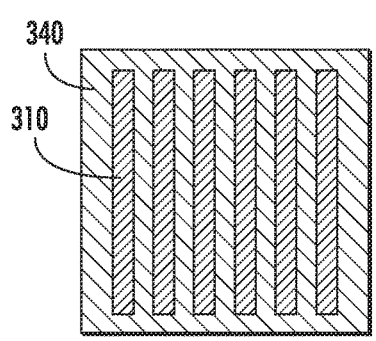
Figure 4D:
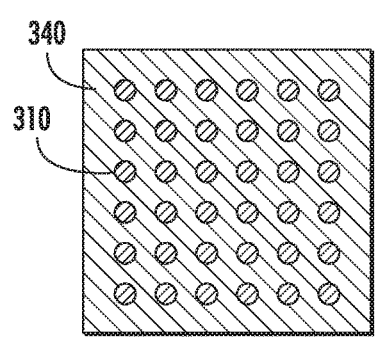

After the patterned implant, a coating is applied to the surface of the workpiece, as shown in Process 210 of FIG. 2. This coating is selected to adhere only to the first implanted regions 310. For example, the coating may only adhere to hydrophilic surfaces. FIGS. 3B and 4B show a coating 330 being applied only over the first implanted regions 310.

Unlike the mask 130, the coating 330 is deposited directly on the workpiece 10. The coating 330 may be of such a thickness so as to block subsequently implanted ions from penetrating the coating 330 and penetrating the underlying first implanted regions 310.

In some embodiments, the coating 330 is selected based on the surface properties of the first implanted regions 310. In certain embodiments, the coating may be water soluble or soluble in commonly available organic solvents. Examples of water-soluble coatings may include, but are not limited to, water-soluble color dyes/compounds. Other examples include water-soluble polymeric compounds such as polyethylene glycol (PEG), which can form a polymeric coating selectively on hydrophilic surfaces. The coating maybe applied by spin coating, dip coating or other polymer deposition techniques, such as molecular layer deposition (MLD). Of course, other methods of applying the coating may be used, such as, but not limited to, using brushes, roller or another applicator.

MLD is a process that may be suited to produce a coating that meets the selectivity and thickness criteria. The first implanted regions 310 may react with 3-aminoproyltriethoxysilane (APTES) or 3-aminopropyltrimethoxysilane (APTMS) to provide an amine-terminated surface, which can react with precursor A and precursor B sequentially and repetitively to form a thicker polymeric layer. Precursor A may include bifunctional organic molecules with acidic functionalities, such as adipoyl dichloride (111-50-2), pyromellitic acid anhydride (PMDA) (89-32-7), 1,4-diisocyanatobenzene (104-49-4), 1,4-diisothiocyantobenzene (4044-65-9), 1,4-benzenedicaboxaldehyde (623-27-8) and 1,4-benzenedicarbonyldichloride (100-20-9). Precursor B may include bifunctional organic molecules with amino or hydroxyl functionalities, such as 1,6-hexanediamine (124-09-4), 1,4-butanediamine (110-60-1), 1,4-butynediol (110-65-6), 1,4-benzenediamine (106-50-3), ethylene glycol (107-21-1) (CAS numbers are given in parentheses). The resultant polymeric compounds include polyamide, polyimide, polyurea, polythiourea, polyurethane, polyazomethine and polyester. This in-situ process may be carried out in liquid phase by dip coating.

3-cyanopropyltrichlorosilane (1071-27-8) can also be used to selectively bind to the first implanted region 310 with a cyano group protruding from the surface. The cyano group can be hydrolyzed in aqueous acid to carboxylic acid or reduced to an amino group using various reducing agents, such as, for example, $NaBH_4$ in ethanol. The carboxylic or amino function can be used as template for further polymerization through MLD, as described above.

In another embodiment, 1,2-Bis(trimethoxysilyl)ethane (91166-50-6) can also be used to selectively bind to first implanted regions 310. However, unlike the compounds described above, this particular compound has the potential to undergo self polymerization to meet the criteria of self-aligned masking. The coating may be formed by attaching a plurality of molecules of the same compound on top of one another.

Other compounds or molecules may be used, depending on the implanted species. For example, polymeric siloxane molecules may be spin coated or dip coated. This process may not involve in-situ polymerization and selectivity depends on whether the process is self-assembled or not. Examples include poly(dimetylsiloxane), hydroxyl terminated (Av Mn=550), poly(dimethylsiloxane), vinyl terminated (Av Mn=25000), poly(dimethylsiloxane-co-diphenylsiloxane), dihydroxy terminated, poly(dimethylsiloxane), chlorine terminated (Av Mn=3000).

To further improve the selectivity of the coating between the first implanted regions 310 and the unimplanted regions 320, the unimplanted regions 320 may optionally be further functionalized. In one embodiment, the unimplanted regions 320 may be treated using known and commonly found chemical agents, such as hexamethyldisliazane (HMDS), that render the surface of the workpiece completely hydrophobic. For example, HDMS molecules may be applied to the surface of the workpiece. The first implanted regions 310 may reject the HDMS molecules, while these molecules interact with the unimplanted regions 320.

As described above, the coating 330 is applied to the surface of the workpiece, and adheres only to first implanted regions 310. After the coating has been applied, a second implant is performed, as shown in Process 220 of FIG. 2. This second implant is performed without the mask 130 disposed between the ion source 110 and the workpiece 10. Consequently, this implant may be referred to as a blanket implant. However, the coating 330 serves as a hard mask, which is defined as a mask that is disposed directly on the workpiece being implanted.

This second implant may be performed using second ions having the opposite conductivity of the dopant ions used for the patterned implant. For example, if the dopant species used for the patterned implant (Process 200) was an n-type dopant, such as phosphorus, the second ions used for the second implant may be a p-type dopant, such as boron. Thus, the previously unimplanted regions 320 are now implanted by the second implant, forming second implanted regions 340, while the coating 330 blocks the second ions from the second implant from penetrating the first implanted regions 310. The degree of blocking afforded by the coating 330 may be based on various factors, including the thickness of the coating, the temperature of the workpiece, and the plasma stability. The coating 330 may block most of the second ions from penetrating the first implanted regions 310. In certain embodiments, the blocking efficiency, which is defined as the percentage of second ions that are blocked by the coating 330, may be at least 90%. Thus, after Process 220, the workpiece has second implanted regions 340 and first implanted regions, which remain covered by the coating 330.

Sometime after the second implant, the coating 330 is removed, as shown in Process 230 of FIG. 2. In the case of a water-soluble coating, the workpiece 10 may be rinsed with water to remove the coating 330. In other embodiments, a suitable solvent may be used to rinse the coating 330 from the workpiece 10. In certain embodiments, the coating 330 may be removed by the application of heat to the workpiece. In certain embodiments, the coating 330 is removed immediately after Process 220. In other embodiments, one or more subsequent processes may be performed while the coating 330 is still in place.

After the coating 330 is removed, the workpiece comprises a first implanted region 310 and a second implanted region 340, where the sum of the first implanted region 310 and the second implanted region 340 constitutes the entirety of the surface of the workpiece. Further, due to the self-aligning nature of the coating process, there is no overlap between the first implanted region 310 and the second implanted region 340. Additionally, the first implanted region 310 comprises first ions and the second implanted region 340 comprises second ions, where the conductivity of the second ions may be opposite the conductivity of the dopant species contained within the first ions.

By exploiting the surface properties of the first implanted regions 310, it is possible to create a hard mask, in the form of a polymer coating, which covers only the first implanted regions 310. Because of this, the second implant process implants only the regions that were not implanted by the first implant. This creates a workpiece with complementary dopant regions with relatively high precision.

The embodiments of this disclosure have many advantages. First, the use of a coating that adheres only to the first implanted regions provides a self-aligned mask. This self-aligned mask has a high degree of precision. Second, this approach yields a simplified process flow and should considerably reduce the extra costs associated with the in-situ masking and alignment hardware as well as result in a higher throughput implant process. Finally, the self-aligned mask allows maximizing the dopant coverage for a given cell architecture, regardless of the complexity of the different structures/shapes.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of creating complementary implanted regions on a workpiece, comprising:
    performing a patterned implant, where a mask is used to block first ions from reaching portions of the workpiece, creating first implanted regions and unimplanted regions;
    applying a coating to a surface of the workpiece, wherein the coating adheres to the first implanted regions and does not adhere to the unimplanted regions; and
    performing a second implant while the coating is disposed on the first implanted regions, so that second ions of the second implant are implanted into the unimplanted regions, forming second implanted regions, and wherein the coating blocks the second ions from penetrating the first implanted regions,
    wherein applying the coating comprises:
        applying a first material to the surface of the workpiece, wherein the first material adheres to the first implanted regions; and
        alternately depositing a first precursor and a second precursor on the first material so as to form a polymeric compound on the first implanted regions.

2. The method of claim 1, wherein the first precursor comprises a bifunctional organic molecule with acidic functionalities, and the second precursor comprises a bifunctional organic molecule with amino or hydroxyl functionalities.

3. The method of claim 1, wherein the first implanted regions are made hydrophilic by the patterned implant, and the coating adheres to hydrophilic surfaces.

4. The method of claim 1, wherein the first ions comprise a dopant species and a surface modifying species.

5. The method of claim 1, further comprising performing a second patterned implant, wherein the patterned implant implants a dopant species and the second patterned implant implants a surface modifying species.

6. The method of claim 1, wherein the coating is applied using molecular layer deposition.

7. The method of claim 1, further comprising removing the coating after the second implant.

8. The method of claim 7, wherein the coating is removed using a solvent.

9. The method of claim 7, wherein the coating is removed using heat.

10. The method of claim 1, further comprising making the unimplanted regions more hydrophobic prior to applying the coating.

11. A method of implanting regions on a workpiece, comprising:

performing a patterned implant using first ions, wherein the first ions comprise a dopant species and a surface modifying species, so as to create first implanted regions and unimplanted regions, wherein the first implanted regions become hydrophilic;

applying a polymeric coating to the workpiece, using molecular layer deposition, wherein the polymeric coating adheres to the first implanted regions and does not adhere to the unimplanted regions; and performing a second implant using second ions while the polymeric coating is disposed on the first implanted regions, wherein the polymeric coating blocks the second ions from the first implanted regions and the second ions are implanted into the unimplanted regions, forming second implanted regions.

12. The method of claim 11, wherein applying the polymeric coating comprises:
applying a first material to a surface of the workpiece, wherein the first material adheres to hydrophilic surfaces;
alternately depositing a first precursor and a second precursor on the first material so as to form a polymeric compound.

13. The method of claim 12, wherein the polymeric compound is selected from the group consisting of polyamide, polyimide, polyurea, polythiourea, polyurethane, polyazomethine and polyester.

14. The method of claim 13, wherein the first precursor comprises a bifunctional organic molecule with acidic functionalities, and the second precursor comprises a bifunctional organic molecule with amino or hydroxyl functionalities.

15. The method of claim 12, wherein the first material is selected from the group consisting of:
3-aminoproyltriethoxysilane (APTES),
3-aminopropyltrimethoxysilane (APTMS) and
3-cyanopropyltrichlorosilane.

16. The method of claim 11, wherein applying the polymeric coating comprises:
applying 1,2-Bis(trimethoxysilyl)ethane (91166-50-6) to a surface of the workpiece, wherein the 1,2-Bis(trimethoxysilyl)ethane (91166-50-6) adheres to hydrophilic surfaces;
attaching a plurality of molecules of 1,2-Bis(trimethoxysilyl)ethane (91166-50-6) on top of one another so as to form a polymeric compound.

17. The method of claim 11, further comprising making the unimplanted regions more hydrophobic prior to applying the polymeric coating.

18. The method of claim 17, wherein hexamethyldisliazane (HMDS) is applied to a surface of the workpiece to make the surface more hydrophobic.

* * * * *